United States Patent
Dubost et al.

(10) Patent No.: US 9,753,290 B2
(45) Date of Patent: Sep. 5, 2017

(54) MODULAR LASER APPARATUS

(71) Applicant: SAINT-GOBAIN GLASS FRANCE, Courbevoie (FR)

(72) Inventors: Brice Dubost, Courbevoie (FR); Emmanuel Mimoun, Boulogne-Billancourt (FR); Jean-Philippe Schweitzer, Chamant (FR)

(73) Assignee: SAINT GOBAIN GLASS FRANCE, Courbevoie (FR)

( * ) Notice: Subject to any disclaimer, the term of this patent is extended or adjusted under 35 U.S.C. 154(b) by 0 days.

(21) Appl. No.: 15/024,486

(22) PCT Filed: Oct. 16, 2014

(86) PCT No.: PCT/FR2014/052642
§ 371 (c)(1),
(2) Date: Mar. 24, 2016

(87) PCT Pub. No.: WO2015/059388
PCT Pub. Date: Apr. 30, 2015

(65) Prior Publication Data
US 2016/0216522 A1     Jul. 28, 2016

(30) Foreign Application Priority Data

Oct. 21, 2013   (FR) ...................................... 13 60222

(51) Int. Cl.
*G02B 27/09*     (2006.01)
*G02B 27/10*     (2006.01)
(Continued)

(52) U.S. Cl.
CPC ...... *G02B 27/0961* (2013.01); *B23K 26/0604* (2013.01); *B23K 26/0608* (2013.01);
(Continued)

(58) Field of Classification Search
CPC  B23K 26/06; B23K 26/0604; B23K 26/0608; B23K 26/0613; B23K 26/0648;
(Continued)

(56) References Cited

U.S. PATENT DOCUMENTS 5,665,985 A      9/1997   Iwata
6,005,717 A  *  12/1999   Neuberger ............. G02B 27/09
                                                         359/618
(Continued)

FOREIGN PATENT DOCUMENTS

JP          57-37325 A      3/1982
JP       2002-268001 A      9/2002
(Continued)

OTHER PUBLICATIONS

International Search Report Issued Mar. 3, 2015 in PCT/FR2014/052642 Filed Oct. 16, 2014.

*Primary Examiner* — Loha Ben
(74) *Attorney, Agent, or Firm* — Oblon, McClelland, Maier & Neustadt, L.L.P.

(57) ABSTRACT

A laser apparatus includes a plurality of laser modules each generating a laser line in a working plane. The laser modules are juxtaposed so that the laser lines generated by the modules combine into a single laser line. Each of the laser modules includes at least one laser line generator and a laser line shaper. The laser line shaper includes an array of microlenses such that the final laser line generated by each laser module has, in the working plane, a power density profile with a width ($L_{90}$) at 90% of the maximum power density and a width ($L_{10}$) at 10% of the maximum power density. A ratio $L_{90}/L_{10}$ is between 1/15 and 1/5.

13 Claims, 3 Drawing Sheets

(51) Int. Cl.
  *B23K 26/06* (2014.01)
  *H01S 5/40* (2006.01)
  *B23K 26/067* (2006.01)
  *B23K 26/073* (2006.01)
  *G02B 3/06* (2006.01)
  *G02B 3/00* (2006.01)

(52) U.S. Cl.
  CPC ...... *B23K 26/0648* (2013.01); *B23K 26/0676* (2013.01); *B23K 26/0738* (2013.01); *G02B 3/005* (2013.01); *G02B 27/0911* (2013.01); *G02B 27/0927* (2013.01); *G02B 27/0966* (2013.01); *H01S 5/4012* (2013.01); *H01S 5/4025* (2013.01); *G02B 3/0006* (2013.01); *G02B 3/0081* (2013.01); *G02B 3/06* (2013.01); *G02B 27/09* (2013.01)

(58) Field of Classification Search
  CPC ............ B23K 26/0676; B23K 26/0738; G02B 3/0006; G02B 3/005; G02B 3/0081; G02B 3/06; G02B 27/09; G02B 27/0905; G02B 27/0911; G02B 27/0927; G02B 27/0961; G02B 27/0966; H01S 5/4012; H01S 5/4025
  USPC .............. 359/618, 619, 621, 622, 626, 641; 372/29.012, 33, 34, 70; 219/121.76
  See application file for complete search history.

(56) References Cited

U.S. PATENT DOCUMENTS

| | | | |
|---|---|---|---|
| 6,717,105 B1* | 4/2004 | Okamoto | B23K 26/0738 219/121.76 |
| 8,749,888 B2* | 6/2014 | Mikhailov | G02B 27/0927 359/626 |
| 9,048,633 B2* | 6/2015 | Gronenborn | B23K 26/0608 |
| 2012/0281293 A1 | 11/2012 | Gronenborn et al. | |

FOREIGN PATENT DOCUMENTS

| | | |
|---|---|---|
| JP | 2005-221872 A | 8/2005 |
| WO | 2008/024211 A2 | 2/2008 |

* cited by examiner

MODULAR LASER APPARATUS

BACKGROUND OF THE INVENTION

The present invention relates to an apparatus for laser annealing large-width substrates, said apparatus being formed from a plurality of juxtaposable laser modules, without particular limitation.

It is known to carry out local rapid laser annealing (laser flash heating) of coatings deposited on flat substrates. To do this, the substrate with the coating to be annealed is run under a laser line, or else a laser line is run over the substrate bearing the coating.

Laser annealing allows thin coatings to be heated to high temperatures, of about several hundred degrees, while preserving the underlying substrate. Run speeds are of course preferably as high as possible, advantageously at least several meters per minute.

The present invention in particular relates to lasers using laser diodes. The latter are currently the best laser sources from the point of view of price and power.

In order to obtain the powers per unit length required to implement a process with a high run speed, it is desirable to concentrate the radiation of a very large number of laser diodes into a single laser line. At the substrate bearing the coating to be annealed, the power density of this laser line must generally be as uniform as possible, so as to expose all the points of the substrate to the same annealing energy.

Moreover, it would be desirable to be able to treat, at high speed, substrates of large width, such as the "jumbo" size (6 m×3.21 m) flat glass sheets produced by float processes. The problem as regards obtaining very long laser lines lies with the production of a system allowing laser modules to be juxtaposed so that the length of the line may be increased at will while avoiding the need for monolithic optical assemblies that are as long as the line itself.

Such modular laser apparatuses have already been envisioned. Thus, prior art U.S. Pat. No. 6,717,105 describes a modular laser apparatus of very simple design. In this laser apparatus, each laser oscillator generates a laser beam that, after it has been shaped, is reflected by a mirror and projected, in the form of a laser line, at a right angle onto the substrate. The means for shaping the laser beam are designed so as to form, at the intersection with the substrate, a laser line having a top-hat power density profile with a very wide central portion in which the power density is high and constant and, at either end of this plateau, steeply sloped falling sides. The profiles are combined by superposing the steep sides so as to create a single combined line with a power density distribution that is as uniform as possible.

Laser modules generating this type of top-hat laser line profile are however very sensitive to possible errors made when positioning the modules relative to one another. Specifically, the high steepness of the slopes in the superposed lateral zones means that if the spacing between modules is too large a power density flaw is easily formed at the junction and, conversely, modules that are too closely spaced will lead to junction zones in which the power density is excessively high.

The Applicant has observed that it is possible to significantly decrease the sensitivity of a modular laser apparatus to errors in the positioning of respective laser modules by equipping the modules of the apparatus with a microlens-based, laser-line shaping, optical system that does not create a "top-hat" power density profile, as was generally the case in the prior art, but rather a "witches-hat" type profile, i.e. a profile that approaches a triangle, with a steadily falling slope from its center to its ends.

BRIEF SUMMARY OF THE INVENTION

The subject of the present invention is a laser apparatus comprising a plurality of laser modules each generating a laser line in a working plane, said laser modules being juxtaposed so that the laser lines generated by the modules combine into a single laser line, each of the laser modules comprising:

at least one means for generating a laser line, preferably a linear array of laser diodes; and a means for shaping the laser line, said apparatus being characterized in that the means for shaping the laser line comprises a first linear array of microlenses, a convergent lens and a second linear array of microlenses placed in the focal plane of the convergent lens, such that the final laser line has, in the working plane, a power density profile with a width ($L_{90}$) at 90% of the maximum power density and a width ($L_{10}$) at 10% of the maximum power density, the ratio $L_{90}/L_{10}$ being comprised between 1/15 and 1/5, preferably between 1/12 and 1/7 and in particular between 1/10 and 1/8.

Therefore, in contrast to the prior art, in the present invention it is not sought to manufacture laser modules that each emit a laser line with a power density profile comprising a useful power plateau that is as large as possible. On the contrary, it is sought to decrease the extent of the high-power central zone ($L_{90}$) to less than 20%, preferably less than 50% and in particular less than 10% of the total length of the laser line of the module, and also to decrease the value of the slope on either side of the zone of maximum power. This is because the lower the slope of the two sides of the power density profile emitted by each module, the smaller the effect of any errors made when positioning the modules will be on the combined power density profile formed by the linear array of modules. The ideal shape of the power profile of a line generated by each module is therefore a triangle having a height (h) equal to the maximum power and a base (b) equal to the length of the laser line.

Ideally, the slope of the sides of the power density profile is therefore equal to that of this triangle (2h/b).

The actual power density profile may however differ slightly from a strictly triangular shape.

Preferably, the final laser line generated by each laser module has, in the working plane, a power density profile with a maximum power density at the center of the laser line, the power density decreasing steadily from the center to the ends of the laser line, the slope of the decrease differing by at most 20% and preferably by at most 10% from the slope of a perfectly triangular profile of same $L_{10}$ and $L_{90}$. The expression "slope of the decrease" here designates the average slope observed over a length equal to 1/50 of the length of the laser line.

The laser modules are juxtaposed so that the power density profile of the combined laser line, resulting from the sum of all the individual power density profiles, is a top-hat profile having a central zone representing at least 90% of the total length of the combined laser line of the apparatus, in which zone the power density varies by at most 10%, preferably by at most 5% and particularly advantageously by at most 1%.

The small width ($L_{90}$) of the useful power zone of the triangular profiles of each module is compensated for in the apparatus of the present invention by a very large overlap of the individual laser lines generated by two adjacent modules.

Specifically, in order to produce a top-hat combined profile from individual triangular "witches-hat" profiles, it is indispensable for almost all of the points of the final profile to result from the addition of at least two individual profiles that partially overlap.

In a preferred embodiment of the present invention, the laser modules are juxtaposed in such a way that each end of a laser line generated by a laser module is located in the immediate proximity of the center of the laser line generated by the adjacent module. Thus, in the central portion of the combined profile where the power density is constant, each point of the laser line is preferably made of some of two triangular laser profiles generated by two different neighbouring laser modules, respectively.

This way of combining profiles is very different to that used in the prior art in which it was generally sought to generate and combine a plurality of individual "top-hat" profiles, and in which the zones of overlap of the individual profiles normally did not represent more than a few percent of the total length of the laser line.

In one embodiment of the apparatus of the present invention in which n modules, each generating a laser line of length $L_i$ having a substantially triangular power density profile, are juxtaposed so as to form a single "top-hat" profile (see FIG. 1) the overall length ($L_g$) of this single line is equal to $$L_g = (n+1) \times 0.5 L_i.$$

The overall length $L_g$ is therefore preferably equal to a multiple of half the length of the laser line generated by each module individually.

Systems of lenses allowing laser lines to be given a top-hat power density profile are known from the prior art. Such a system is for example described in patent application US 2012/0127723. It comprises a first microlens array (4) combined with convergent lenses (5) that are larger in size, each receiving the light from a plurality of microlenses. At the focal plane (8) each convergent lens creates a top-hat power density profile (9) having a relatively wide central portion and falling sides (10) having a relatively steep slope.

In the present invention, the microlens array allowing a triangular profile to be obtained is placed in the focal plane of a convergent lens forming a top-hat power density profile. The microlens array comprises a linear array of N cylindrical microlenses of a focal length D.

As will be explained below with reference to FIG. 1, the power density profile of the laser line shaped by this linear array of microlenses varies with distance relative to the microlens array. In the immediate proximity of the linear microlens array it is top-hat shaped. It becomes more and more triangular in shape with distance from the linear array.

The exact distance (D) at which it has a triangular shape may be calculated, as is known, by virtue of the following formula:

$$D = N \times F$$

where
N designates the number of microlenses, and
F designates the focal length of each microlens,
provided that the microlens array is of negligible size relative to the distance between the microlens array and the convergent lens forming the top-hat power density profile.

Advantageously, the working plane (substrate) will be placed at a distance equal to D±15%, preferably to D±5%, and ideally precisely at a distance D from the linear microlens array.

It is of course possible and easy for a person skilled in the art to choose, by virtue of the above formula, a linear array of microlenses that is suitable for obtaining a triangular power density profile at a given distance D.

The modular laser apparatus of the present invention preferably comprises at least 5 modules, in particular at least 10 modules. The laser modules are advantageously juxtaposed so that the laser lines generated combine into a single laser line having a total length longer than 1.2 m, preferably longer than 2 m and in particular longer than 3 m.

With a view to laser treatment of "jumbo" substrates having a width of 3.21 m, the central portion of the laser line where the power density is substantially constant preferably has a length comprised between 3.20 and 3.22 m.

Moreover, the laser modules are assembled and mounted on the laser apparatus so that the laser lines generated cut the substrate, or working plane, preferably at a small angle, typically smaller than 20° and preferably smaller than 10° relative to the normal to the substrate. The apparatus may be designed so that the laser modules remain stationary, the substrate to be treated running under or over the linear array of modules, generally in a direction perpendicular to the main axis of the laser line. As a variant, the apparatus may be designed so that the substrate remains stationary and the linear array of laser modules runs above or below the substrate while projecting the laser line thereon.

BRIEF DESCRIPTION OF THE SEVERAL VIEWS OF THE DRAWINGS

The invention will now be described with reference to the appended figures, in which.

DETAILED DESCRIPTION OF THE INVENTION

Figure 1:
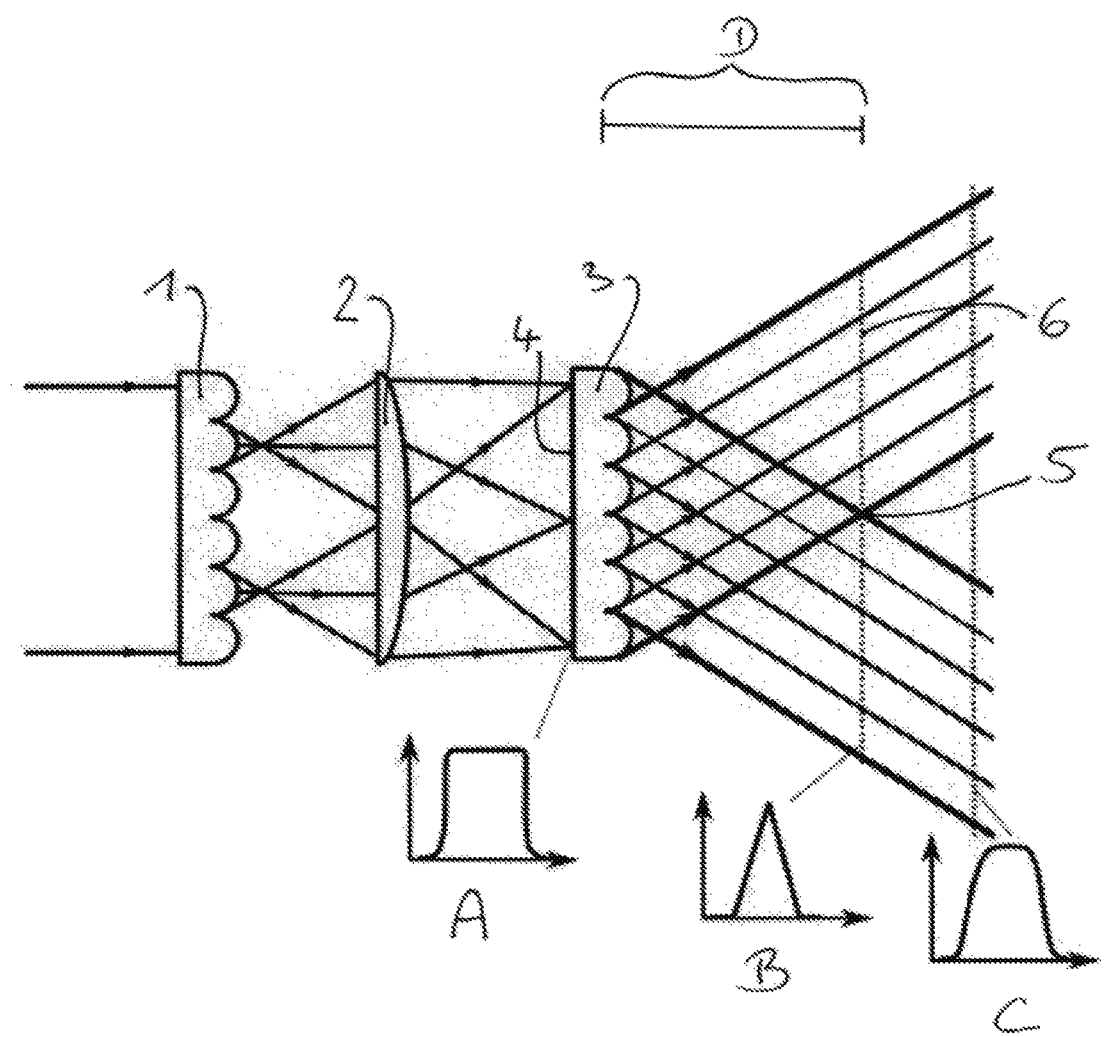
FIG. 1 is an explanatory schematic showing an optical system allowing a laser line having a triangular power density profile to be obtained.

In FIG. 1, the combination of a linear array 1 of microlenses and of a convergent lens 2 results, in the focal plane 4 of the latter, in a laser line having a top-hat power density profile A. A second linear array 3 of microlenses is placed precisely in the focal plane 4 of the convergent lens 2. Each of the microlenses of the linear array 3 produces a beam that first converges, then diverges beyond the focal point. The beams of the two microlenses located at the ends of the linear array of microlenses cross at the point 5. This point 5 of crossover of the two outermost beams of the laser line is located on the straight line 6, parallel to the linear array 3 of microlenses, where the power density profile of the laser line has the triangular profile B. This straight line 6 is at a distance D from the linear array 3 of microlenses. The substrate to be treated (not shown) must be placed so that the straight line 6 is located in the plane of said substrate. At a distance D' larger than D, the shape of the power density profile C once more approaches that of a top hat.

The means for shaping the laser line (comprising a first linear array 1 of microlenses, a convergent lens 2 and a second linear array 3 of microlenses) placed in the focal plane of the convergent lens 2, protects the system from flaws in irradiation intensity uniformity in the case of failure of one or more of the individual laser sources placed behind one or more of the microlenses of the linear array 1 of microlenses. Specifically, the light originating from all of the laser sources of a module is mixed in the convergent lens 2 then shaped by the array 3 of microlenses. The failure of a laser diode placed behind a microlens of the first linear array of microlenses results in a decrease in the power of the laser line, but not in a flaw in the uniformity of the intensity.

Figure 2:
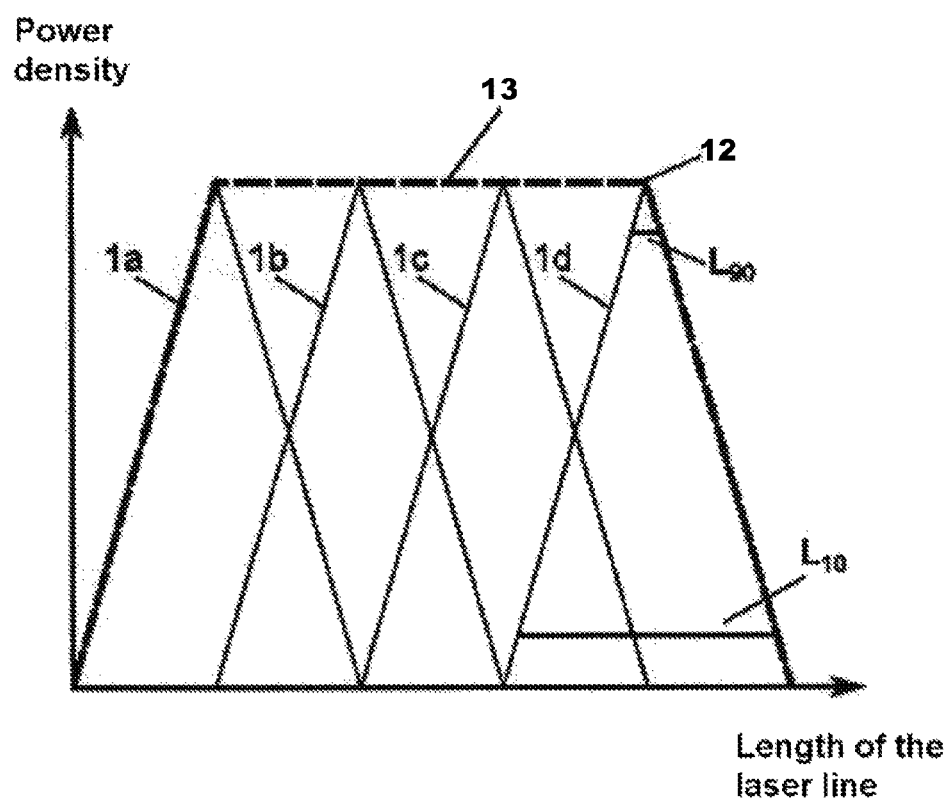
FIG. 2 is an explanatory schematic showing how to combine a plurality of triangular power density profiles in order to obtain a combined profile having a top-hat shape.

FIG. 2 shows the power density profiles 1$a$, 1$b$, 1$c$, 1$d$ of four laser lines generated by four modules (not shown) that have been juxtaposed according to the present invention. The four profiles are identical in shape. Each profile has a maximum power density 12, a width $L_{90}$ at 90% of the maximum power density, and a width $L_{10}$ at 10% of the maximum power density. The dotted profile 13 corresponds to the power density profile resulting from the addition of the individual triangular profiles. This profile has a top-hat shape. The laser modules (not shown) are placed so that, in the plateau portion of the overall profile 13, each of the points of the profile results from the addition of the profiles of two neighboring laser modules.

Figure 3:
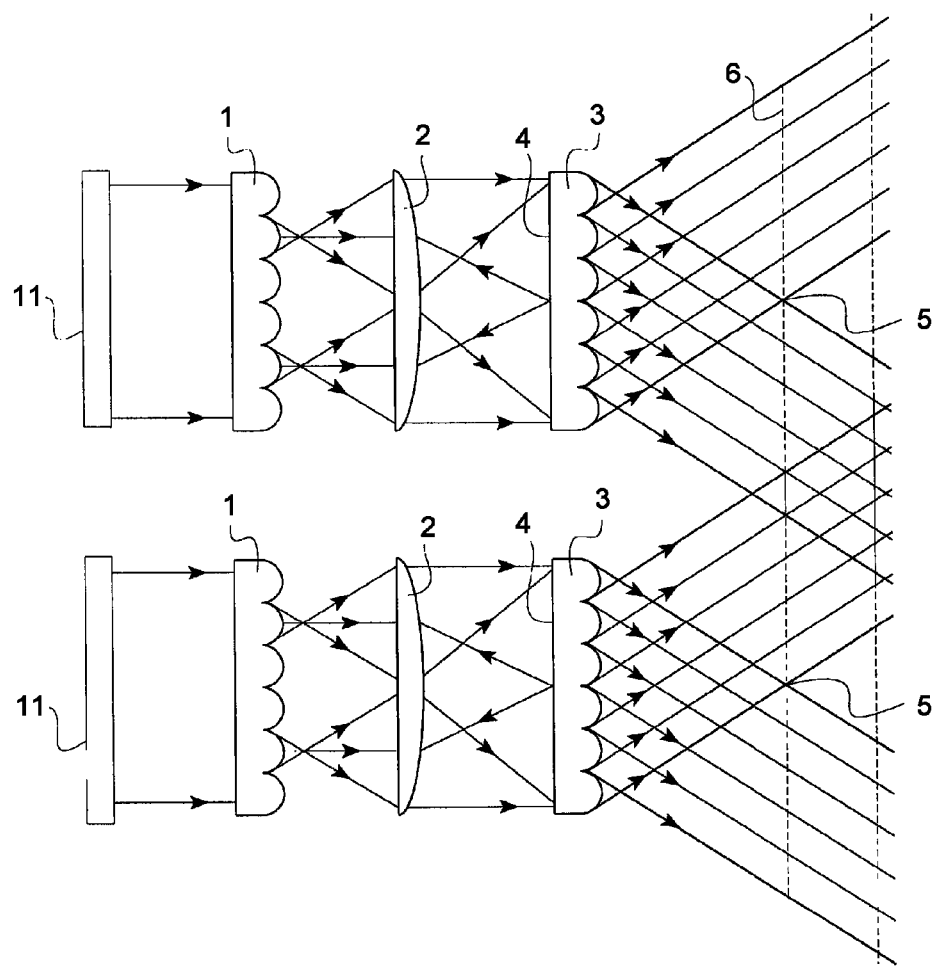
FIG. 3 is an exemplary schematic showing an optical system having a plurality of laser modules.

FIG. 3 shows a plurality of laser modules each including a laser line generator 11, two arrays of microlenses 1, 3, and a convergent lens 4 that shape the first laser line into a final laser line.

The invention claimed is:

1. A laser apparatus comprising:
a plurality of laser modules each generating an individual final laser line in a working plane, said laser modules being juxtaposed so that the individual final laser lines generated by the modules combine into a combined final laser line, each of the laser modules comprising:
at least one means for generating a first laser line; and
a means for shaping the first laser line into the individual final laser line,
wherein the means for shaping the first laser line into the individual final laser line comprises a first linear array of microlenses, a convergent lens, and a second linear array of microlenses placed in the focal plane of the convergent lens, such that the individual final laser line generated by each laser module has, in the working plane, a power density profile with a width ($L_{90}$) at 90% of a maximum power density and a width ($L_{10}$) at 10% of the maximum power density, a ratio $L_{90}/L_{10}$ being between 1/15 and 1/5, the laser modules being juxtaposed so that the individual final laser lines generated by the modules combine into the combined final laser line having a total length longer than 1.2 m but less than an infinite length.

2. The laser apparatus as claimed in claim 1, wherein the ratio $L_{90}/L_{10}$ is between 1/12 and 1/7.

3. The laser apparatus as claimed in claim 1, wherein the ratio $L_{90}/L_{10}$ is between 1/10 and 1/8.

4. The laser apparatus as claimed in claim 1, wherein the individual final laser line generated by each laser module has, in the working plane, a power density profile with a maximum power density at a center of the laser line, the power density decreasing from the center to ends of the laser line, a slope of the decrease differing by at most 20% from a slope of a perfectly triangular profile of same $L_{10}$ and $L_{90}$.

5. The laser apparatus as claimed in claim 1, wherein the individual final laser line generated by each laser module has, in the working plane, a power density profile with a maximum power density at a center of the laser line, the power density decreasing from the center to ends of the laser line, a slope of the decrease differing by at most 10% from a slope of a perfectly triangular profile of same $L_{10}$ and $L_{90}$.

6. The laser apparatus as claimed in claim 1, wherein the laser modules are juxtaposed so that a power density profile of the combined final laser line, resulting from a sum of all individual power density profiles, is a top-hat profile having a central zone representing at least 90% of a total length of the combined laser line of the apparatus, in which zone the power density varies by at most 10%.

7. The laser apparatus as claimed in claim 1, wherein the laser modules are juxtaposed so that a power density profile of the combined final laser line, resulting from a sum of all individual power density profiles, is a top-hat profile having a central zone representing at least 90% of a total length of the combined final laser line of the apparatus, in which zone the power density varies by at most 5%.

8. The laser apparatus as claimed in claim 1, wherein the laser modules are juxtaposed so that a power density profile of the combined final laser line, resulting from a sum of all the individual power density profiles, is a top-hat profile having a central zone representing at least 90% of a total length of the combined final laser line of the apparatus, in which zone the power density varies by at most 1%.

9. The laser apparatus as claimed in claim 1, wherein the laser modules are juxtaposed in such a way that each end of an individual final laser line generated by a laser module is located in an immediate proximity of a center of an individual final laser line generated by an adjacent module.

10. The laser apparatus as claimed in claim 1, wherein the plurality of laser modules comprises at least 5 modules.

11. The laser apparatus as claimed in claim 1, wherein the plurality of laser modules comprises at least 10 modules.

12. The laser apparatus as claimed in claim 1, wherein the total length of the combined final laser line is longer than 2 m but less than an infinite length.

13. The laser apparatus as claimed in claim 1, wherein the total length of the combined final laser line is longer than 3 m but less than an infinite length.

* * * * *